(12) United States Patent
Horiguchi

(10) Patent No.: US 9,917,097 B2
(45) Date of Patent: Mar. 13, 2018

(54) METHOD OF MANUFACTURING SEMICONDUCTOR DEVICE

(71) Applicant: Toshiba Memory Corporation, Minato-ku (JP)

(72) Inventor: Kazunori Horiguchi, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/060,812

(22) Filed: Mar. 4, 2016

(65) Prior Publication Data
US 2017/0200732 A1   Jul. 13, 2017

Related U.S. Application Data

(60) Provisional application No. 62/275,895, filed on Jan. 7, 2016.

(51) Int. Cl.
| | | |
|---|---|---|
| *H01L 27/11514* | (2017.01) | |
| *H01L 27/11582* | (2017.01) | |
| *H01L 21/02* | (2006.01) | |
| *H01L 21/311* | (2006.01) | |

(52) U.S. Cl.
CPC .... *H01L 27/11582* (2013.01); *H01L 21/0214* (2013.01); *H01L 21/02164* (2013.01); *H01L 21/02271* (2013.01); *H01L 21/31116* (2013.01)

(58) Field of Classification Search
CPC ................................................ H01L 27/11578
See application file for complete search history.

(56) References Cited

U.S. PATENT DOCUMENTS

| | | | |
|---|---|---|---|
| 8,487,365 B2 | 7/2013 | Sasaki et al. | |
| 2015/0129878 A1* | 5/2015 | Shin | H01L 27/11578 257/66 |
| 2015/0206897 A1 | 7/2015 | Kuniya | |
| 2015/0371869 A1* | 12/2015 | Surla | H01L 21/31116 438/723 |
| 2016/0118398 A1* | 4/2016 | Yon | H01L 27/11582 257/314 |

FOREIGN PATENT DOCUMENTS

| | | |
|---|---|---|
| JP | 2011-199194 | 10/2011 |
| JP | 5504053 | 5/2014 |
| JP | 2015-138834 | 7/2015 |

* cited by examiner

*Primary Examiner* — Peniel M Gumedzoe
*Assistant Examiner* — Christopher Johnson
(74) *Attorney, Agent, or Firm* — Oblon, McClelland, Maier & Neustadt, L.L.P.

(57) ABSTRACT

According to an embodiment, a method of manufacturing a semiconductor device includes forming a layered body by alternately stacking a first film and a second film in a plurality of layers, and etching a portion of the layered body to penetrate the layered body from a top to a bottom to form a predetermined shape. The second film includes a first processing object film having a predetermined composition and a second processing object film having a composition that causes the second processing object film to be etched by the etching more easily than the first processing object film. The second processing object film is included as at least one of layers of the second film.

6 Claims, 4 Drawing Sheets

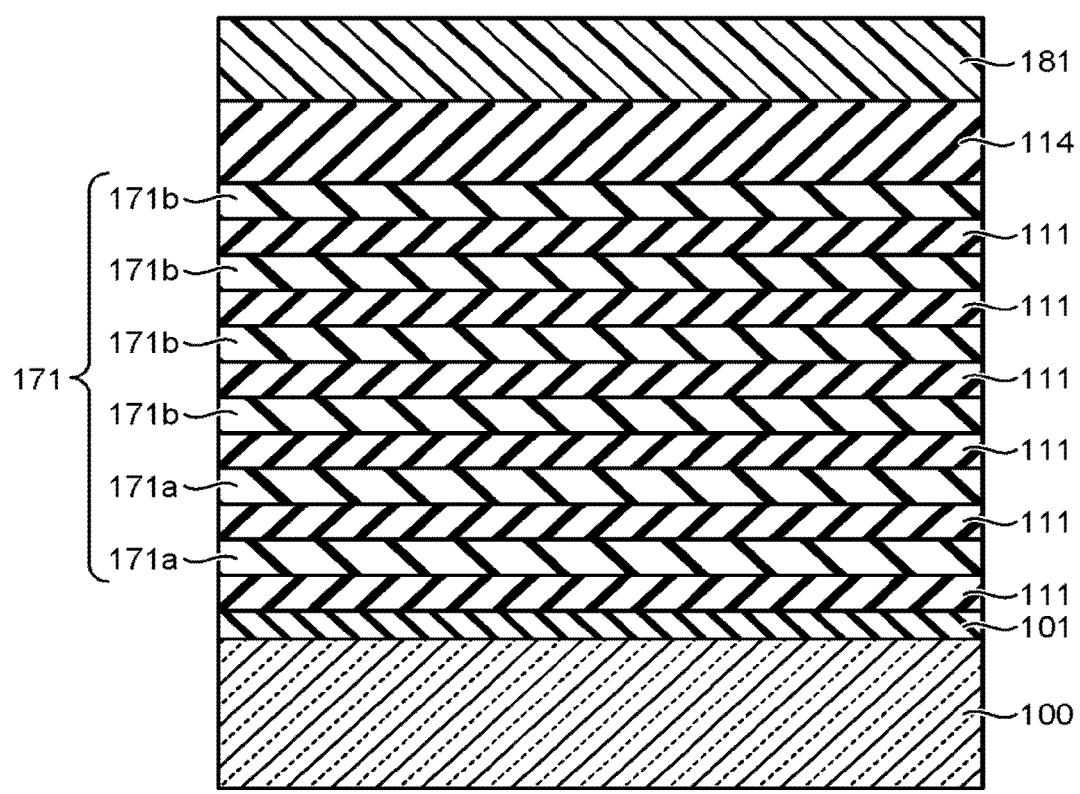

METHOD OF MANUFACTURING SEMICONDUCTOR DEVICE

CROSS-REFERENCE TO RELATED APPLICATIONS

This application is based upon and claims the benefit of priority from U.S. Provisional Application No. 62/275,895, filed on Jan. 7, 2016; the entire contents of which are incorporated herein by reference.

FIELD

Embodiments described herein relate generally to a method of manufacturing a semiconductor device.

BACKGROUND

In recent years, scaling of semiconductor devices has been advanced, and there has been proposed a nonvolatile semiconductor memory device of a three-dimensional structure type that includes memory cells forming a layered structure. According to the nonvolatile semiconductor memory device of the three-dimensional structure type, films to serve as memory elements are stacked in the vertical direction and are processed together, so that a number of memory cells are formed within a unit plane. In this case, the cost per one bit can be reduced.

The nonvolatile semiconductor memory device of the three-dimensional structure type is manufactured as follows. At first, a layered body is prepared by alternately stacking a sacrificial film and a spacer film, each of which is made of an insulating material, to dispose each of them at a plurality of layers, and then memory holes are formed by dry etching in the layered body. Then, a channel and so forth are formed in each memory hole. Thereafter, the sacrificial film is replaced with a conductive material for forming a gate structure in the nonvolatile semiconductor memory device.

When the memory holes are formed, a flux of ions decreases at the bottom side part of each memory hole, and reaction products are not easily removed from the bottom side part of each memory hole. Consequently, the bottom side part of each hole ends up having a tapered shape.

BRIEF DESCRIPTION OF THE DRAWINGS

FIGS. 2A to 2C are sectional views schematically showing an example of the process sequence of a method of manufacturing a nonvolatile semiconductor memory device according to an embodiment.

DETAILED DESCRIPTION

In general, according to one embodiment, a method of manufacturing a semiconductor device includes forming a layered body by alternately stacking a first film and a second film in a plurality of layers, and etching a portion of the layered body to penetrate the layered body from a top to a bottom to form a predetermined shape. The second film includes a first processing object film having a predetermined composition and a second processing object film having a composition that causes the second processing object film to be etched by the etching more easily than the first processing object film. The second processing object film is included as at least one of layers of the second film.

An exemplary embodiment of a method of manufacturing a semiconductor device will be explained below in detail with reference to the accompanying drawings The present invention is not limited to the following embodiment. The sectional views of a semiconductor device used in the following embodiment are schematic, and so the relationship between the thickness and width of each layer and/or the thickness ratios between respective layers may be different from actual states.

Figure 1:
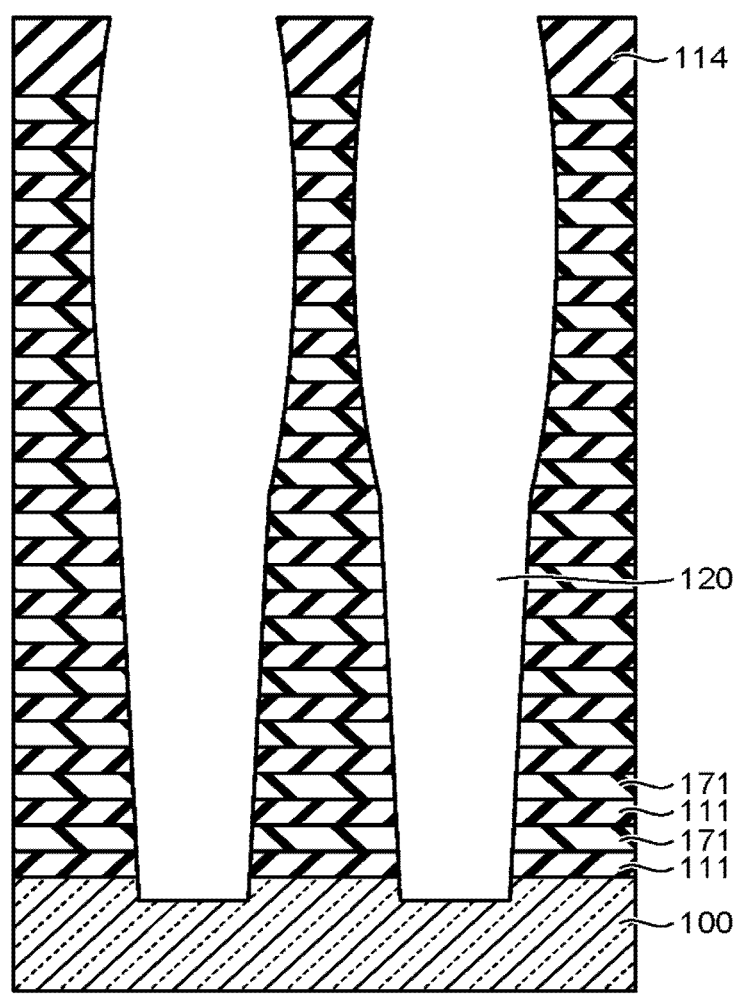
FIG. 1 is a sectional view schematically showing a structural example of a memory hole, by which a memory string is formed, in a nonvolatile semiconductor memory device according to a comparative example.

FIG. 1 is a sectional view schematically showing a structural example of a memory hole, by which a memory string is formed, in a nonvolatile semiconductor memory device according to a comparative example. As shown in FIG. 1, the nonvolatile semiconductor memory device according to the comparative example includes a layered body prepared by alternately stacking a sacrificial film 111 and a spacer film 171 to dispose each of them at a plurality of layers, and memory holes 120 are formed by etching in the layered body. When this etching is performed, a bowing occurs and thereby brings about a portion where the radius of each memory hole 120 for embedding a pillar member HP therein (which will be referred to as a hole radius, hereinafter) is larger than an ideal hole radius. In the example shown in FIG. 1, a bowing occurs in the upper side part above the center in the height direction of the layered body, so that the hole radius becomes larger there. On the other hand, the bottom side part of the memory hole 120 is formed such that the hole radius becomes smaller toward the bottom, and thus it comes to have a tapered shape. In this embodiment, an explanation will be given of a method of manufacturing a semiconductor device, which can improve the tapered shape at the bottom side part of the memory hole 120.

Figure 2B:
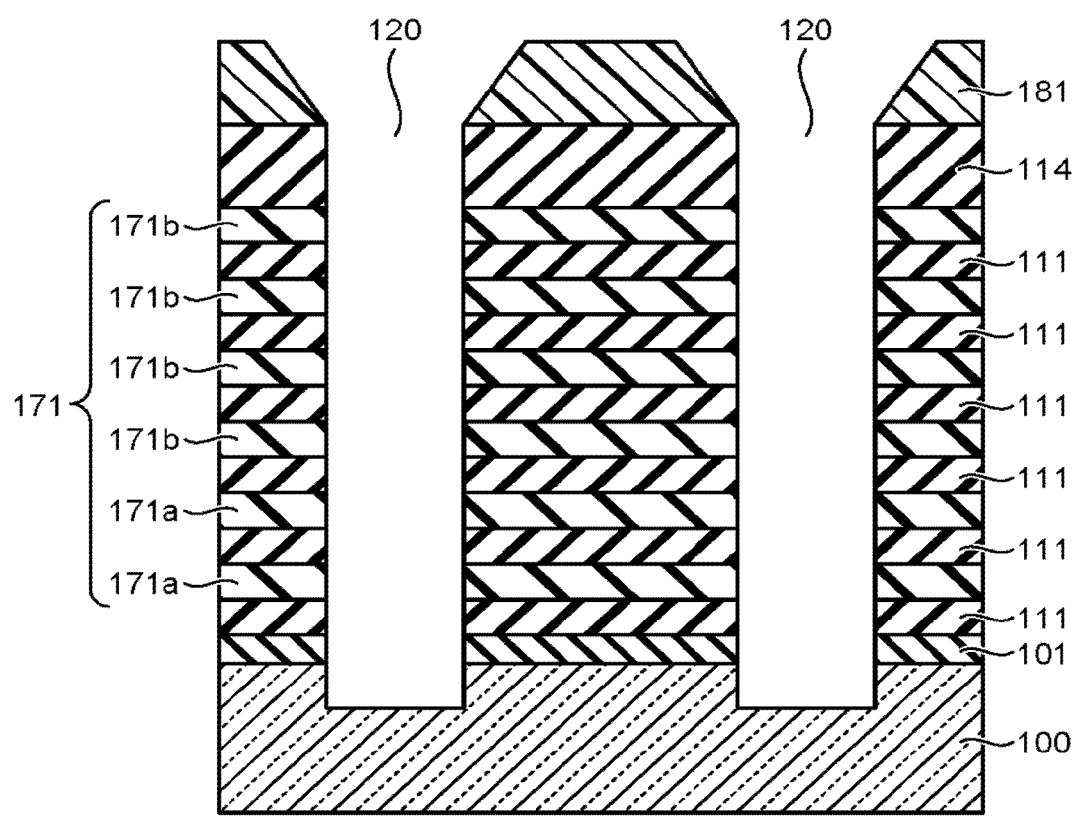
Figure 2C:
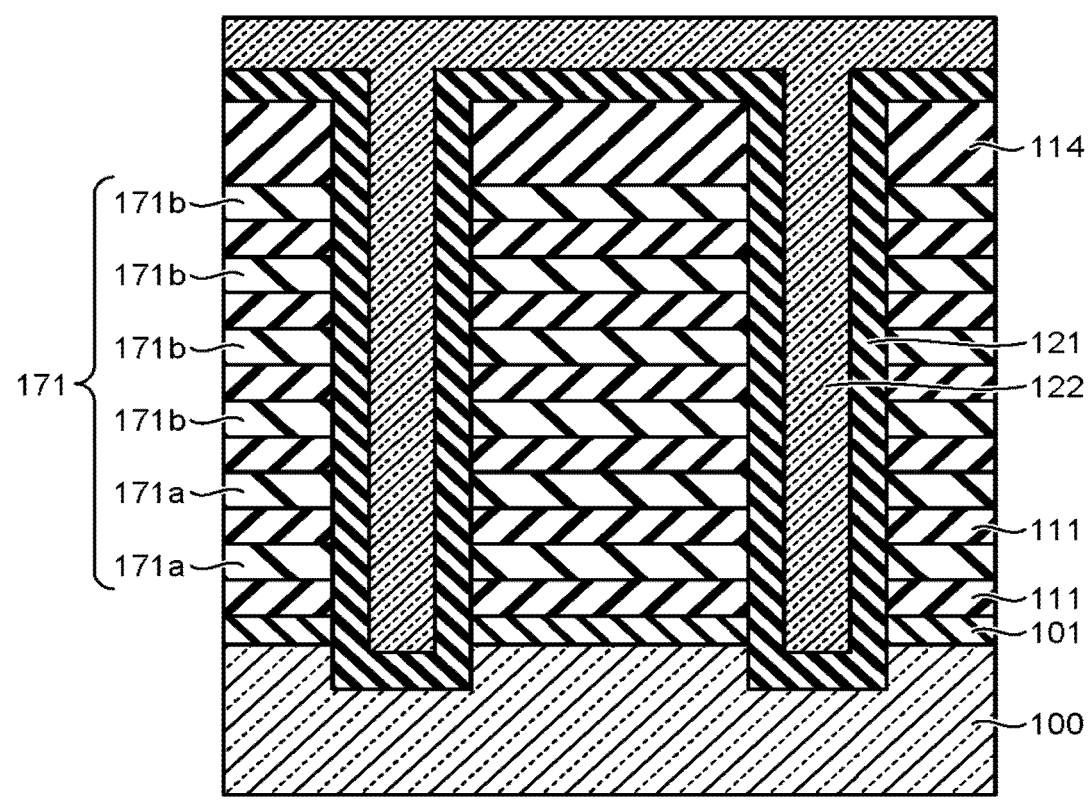

FIGS. 2A to 2C are sectional views schematically showing an example of the process sequence of a method of manufacturing a nonvolatile semiconductor memory device according to an embodiment.

At first, as shown in FIG. 2A, a peripheral circuit and so forth (not shown) are formed on a substrate 100. Then, an insulating film 101 is formed on the peripheral circuit. Thereafter, a spacer film 111 and a sacrificial film 171 are alternately stacked each in a predetermined number of layers on the insulating film 101, and an insulating film 114 is further stacked on the uppermost side, so that a layered body is formed. The sacrificial film 171 will be replaced with a conductive film in a step performed later. The conductive film used for this replacement will serve as a control gate or selection gate. The spacer film ill is disposed to provide insulation and isolation between control gates or between a control gate and a selection gate. As each of the spacer film 111 and the insulating film 114, for example, an oxide film, such as a TEOS (Tetra Ethyl Ortho Silicate) film may be used. The spacer film 111 and the conductive film used for the replacement form a layered structure, which will serve as a control electrode or selection gate electrode in a memory cell array, later. Further, a resist 181 is applied to the entire surface of the layered body. Between the resist 181 and the insulating film 114 on the uppermost side, a structure composed of an Si-containing film and a Carbon layer may be interposed. The spacer film 111 and the insulating film 114 are formed, for example, by use of a CVD (Chemical Vapor Deposition) method.

As the sacrificial film 171, such a material may be used that shows a selective ratio relative to the spacer film 111 when the layered body is etched. Further, at least one of the layers of the sacrificial film 171 is made of a material different in composition from the other layers. The sacrificial film 171 is made of a material containing silicon (Si) and nitrogen (N), for example.

In one example, the layers of the sacrificial film 171 are formed of a silicon nitride film, and at least one of the layers has a ratio of Si to N different from the ratio of Si to N in the other layers. The ratio of Si to N in the sacrificial film 171 is set to a condition such that a layer or layers of the sacrificial film 171 at the bottom side part of the memory hole 120 can be etched more easily as compared with the other height layers of the sacrificial film 171. Here, this condition varies depending on an etching gas used when the memory hole 120 is etched as described later. Accordingly, a ratio of Si to N optimum to every etching gas to be used is obtained by use of an experiment performed in advance.

Further, in another example, the layers of the sacrificial film 171 are formed of a silicon nitride film and a silicon nitride film containing an additive of at least one of the layers. The additive may be exemplified by oxygen (O) or hydrogen (H).

When stacked films composed of a silicon oxide film and a silicon nitride film are etched, a CF-based gas is used in general. A composite matter containing carbon (C), which constituted the CF-based gas, is deposited on the etched sidewall of the memory hole 120 and thereby protects the sidewall. Further, fluorine (F), which constituted the CF-based gas, serves to etch silicon (Si) in the stacked films. At this time, if oxygen is contained in the sacrificial film 171, oxygen is released from the sacrificial film 171 by etching, and thereby the oxygen supply amount is increased. As a result, the effect of protecting the sidewall by the carbon-based composite matter is weakened, and thereby the hole radius is increased. Here, as the oxygen ratio in the silicon nitride film is higher, the amount of oxygen released from the sacrificial film 171 during the etching is increased. Thus, at a position (depth) to increase the hole radius more, the oxygen ratio in the silicon nitride film 171 should be set higher. In this respect, if the oxygen ratio is changed, the ratio of silicon to nitrogen can be also changed.

Further, it is known that, if the stacked films are etched by use of an etching gas containing hydrogen, the etching rate becomes higher. Accordingly, if hydrogen is contained in the sacrificial film 171, the etching is made to proceed by hydrogen in the sacrificial film 171. As a result, the hole radius is increased. Here, as the hydrogen ratio in the silicon nitride film is higher, the etching is made to proceed more. Thus, at a position (depth) to increase the hole radius more, the hydrogen ratio in the silicon nitride film 171 should be set higher. In this respect, if the hydrogen ratio is changed, the ratio of silicon to nitrogen can be also changed.

A silicon nitride film containing such an additive is preferably disposed at lower side layers of the stacked films to prevent the bottom side part of the memory hole 120 formed later from ending up with a tapered shape. Further, in the case that a plurality of layers of the sacrificial film 171 near the bottom of the memory hole 120 are formed of a silicon nitride film containing an additive, they may be designed such that the additive concentration in the lowermost layer of the sacrificial film 171 is set highest and the additive concentration is reduced gradually upward in the layers or its upper side.

Here, in this embodiment, in order to improve the tapered shape of the bottom side part of the memory hole 120, a silicon nitride film containing an additive is disposed at lower side layers of the stacked films. However, if there is observed such a portion that the hole radius is smaller at another depth of the memory hole 120, the silicon nitride film containing an additive may be disposed near this depth.

In this embodiment, the layers of the sacrificial film 171 are composed of a sacrificial film 171a, which is used for disposing layers of the lowermost level and the second level from the bottom, and a sacrificial film 171b, which is used for disposing layers of from the third level from the bottom through to the uppermost level. Here, the sacrificial film 171a is formed of a silicon nitride film doped with oxygen, and the sacrificial film 171b is forged of a silicon nitride film. The silicon nitride film and the silicon nitride film doped with oxygen described above may be formed by use of a CVD method, for example. In the following explanation, if there is no need to distinguish the sacrificial film 171a and the sacrificial film 171b from each other, each of them will be referred to as the sacrificial film 171.

Further, although not shown here, in a word line contact part, etching is performed to each set of the sacrificial film 171 and the spacer film 111 from the top side, so that a stepwise structure is formed. Formation of this stepwise structure can be performed by use of known techniques. Thereafter, a planarization film is formed on the word line contact part including the stepwise structure thus formed. The planarization film may be formed of a silicon oxide film, for example.

Then, as shown in FIG. 2B, patterning is performed to the resist 181 by use of a lithography technique and a development technique. Here, the pattern is formed to include openings at positions for forming memory strings. Then, anisotropic etching is performed by use of an RIE method or the like, through the resist 181 serving as a mask, so that memory holes 120 are formed. The memory holes 120 are formed to penetrate the layered body in the thickness direction. Further, the bottom of each memory hole 120 reaches the semiconductor substrate 100.

When an insulating film containing silicon is etched, a CF-based gas is used in general. In the case of a CF-based gas, F components serve to etch silicon, and C components are deposited on the sidewall of an etched portion and thereby protect the sidewall. When the memory holes 120 are formed, etching is alternately performed to the spacer film 111 and the sacrificial film 171. As described with reference to FIG. 1, while the etching comes closer to the lowermost layer of the layered body, a flux of ions decreases at the bottom side part of each memory hole 120. Further, reaction products are not easily removed from the bottom side part of each memory hole 120. On the other hand, according to this embodiment, the layers from the uppermost level to the fourth level of the layered body are disposed by use of the sacrificial film 171b formed of an ordinary silicon nitride film, and the layers from the fifth level to the lowermost level of the layered body are disposed by use of the sacrificial film 171a formed of a silicon nitride film doped with oxygen. When the sacrificial film 171a is etched at the layers from the fifth level to the lowermost level of the layered body, which correspond to the bottom side part of each memory hole 120, oxygen is released from inside the sacrificial film 171a. Consequently, the oxygen supply amount at the bottom side part of each memory hole 120 is increased, and thereby the effect of protecting the sidewall by the carbon-based composite matter is weakened. As a result, the verticality of the bottom side part of the memory hole 120 is improved, as compared with the comparative example.

Thereafter, as shown in FIG. 2C, a charge accumulation layer 121 is formed on the inner surface of each memory hole 120, and a silicon pillar 122 is further formed in the memory hole 120. As the charge accumulation layer 121, for example, a layered insulating film, such as an ONO film or NONON film (N denotes a silicon nitride film, and O denotes a silicon oxide film), may be used. Further, as the material of the silicon pillar 122, for example, a conductive material, such as doped poly-silicon or doped amorphous silicon, may be used. Thereafter, the portions of the silicon pillar 122 and the charge accumulation layer 121 above the insulating film 114 are removed by use of a CMP (Chemical Mechanical Polishing) method. Further, the sacrificial film 171 is replaced with an electrode film, and then the gate electrodes of selection gates, interlayer insulating films, contact plugs, wiring lines, and so forth (all of them are not shown) are formed, so that a three-dimensional memory is completed.

It should be noted that, in the explanation described above, the sacrificial film 171a formed of a silicon nitride film doped with oxygen is disposed at lower side layers of the layered body, but the silicon nitride film doped with oxygen may be disposed as a sacrificial film at any arbitrary position of the layered body. Further, the number of layers of the sacrificial film 171a is not limited to two layers, but may be one layer or three or more layers. Further, in a case that the sacrificial film 171a is disposed at a plurality of layers, the oxygen concentration in the sacrificial film 171a may be set different between the layers.

Further, the explanation described above is exemplified by a case that the sacrificial film 171a is formed of a silicon nitride film doped with oxygen. However, a similar result can be also obtained by use of a sacrificial film 171a formed of a silicon nitride film doped with another component, such as hydrogen, which accelerates etching. Further, the explanation described above is exemplified by a case that the memory holes 120 is formed, but this may be applied to a case that contact holes or slits are formed in a layered body in which films of two different types are alternately stacked, for example.

According to the embodiment, the layered body, in which the spacer film 111 and the sacrificial film 171 are alternately stacked each in a plurality of layers, is designed such that the sacrificial film 171 is doped with a component for accelerating etching, at a position where the radius of the memory hole 120 becomes smaller than a desired value, when the memory hole 120 is formed in an ordinary way. Consequently, it is possible to form a memory hole 120 having a desired radius when the memory hole 120 is formed by etching, without making the radius smaller even at a position of the memory hole 120 where the radius is made smaller when ordinary etching is used.

Particularly, the sacrificial film 171a near the bottom of the layered body is formed of a silicon nitride film doped with a component for accelerating etching, and the sacrificial film 171b at the other positions is formed of a silicon nitride film. During the etching, when the sacrificial film 171a is etched at the bottom side part of the memory hole 120, oxygen is supplied from the sacrificial film 171a to the bottom side part of the memory hole 120. Since the oxygen supply amount at the bottom side part of the memory hole 120 is increased as compared with the comparative example, the protection effect provided by the carbon-based deposit is weakened. As a result, it is possible to improve the verticality of the sidewall of the memory hole 120.

Here, the explanation described above is exemplified by a case that the memory holes 120 is formed in the layered body prepared by alternately stacking the spacer film ill and the sacrificial film 171 each in a plurality of layers. The embodiment described above is effective when a hole or trench is formed in a layered body of this kind such that the hole or trench extends from the top of the layered body to its bottom.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
    forming a layered body by alternately stacking a first film and a second film as a plurality of layers; and
    etching a portion of the layered body to penetrate the layered body from a top to a bottom to form a predetermined shape;
    wherein each second film is either a first processing object film having a predetermined composition or a second processing object film having a composition that causes the second processing object film to be etched by the etching more easily than the first processing object film, and a plurality of the second processing object films are included in the layered body,
    the plurality of the second processing object films are disposed at a lower side part of the layered body,
    the first film is formed of a silicon oxide film,
    the first processing object film is formed of a film containing silicon and nitrogen, and
    the plurality of second processing object films are formed of a film containing silicon, nitrogen, and oxygen.

2. The method of manufacturing a semiconductor device according to claim 1, wherein
    the first film is formed of a silicon oxide film, and
    the second film is formed of a film containing silicon and nitrogen, such that the plurality of second processing object films differ in a ratio of silicon to nitrogen from the first processing object film.

3. The method of manufacturing a semiconductor device according to claim 1, wherein body,
    a concentration of the oxygen is set higher in the second processing object film on a lower side.

4. The method of manufacturing a semiconductor device according to claim 1, wherein the second film is formed by use of a CVD method.

5. The method of manufacturing a semiconductor device according to claim 1, wherein the etching is performed by use of a CF-based gas.

6. The method of manufacturing a semiconductor device according to claim 1, wherein a memory hole, slit, or contact hole is formed in the layered body by the etching.

* * * * *